(12) United States Patent
Zadesky et al.

(10) Patent No.: US 7,688,574 B2
(45) Date of Patent: Mar. 30, 2010

(54) COLD WORKED METAL HOUSING FOR A PORTABLE ELECTRONIC DEVICE

(75) Inventors: Stephen P. Zadesky, Portola Valley, CA (US); Philip M. Hobson, Menlo Park, CA (US); Tang Yew Tan, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 320 days.

(21) Appl. No.: 11/650,068

(22) Filed: Jan. 5, 2007

(65) Prior Publication Data

US 2008/0165485 A1    Jul. 10, 2008

(51) Int. Cl.
*H05K 5/00* (2006.01)
*H05K 7/00* (2006.01)

(52) U.S. Cl. ............... 361/679.21; 361/679.22; 361/679.3; 361/679.56

(58) Field of Classification Search ............ 361/679.3, 361/679.56, 679.21, 679.22; 455/575.1
See application file for complete search history.

(56) References Cited

U.S. PATENT DOCUMENTS

| | | | |
|---|---|---|---|
| 5,822,192 A | 10/1998 | Hayashi | |
| 5,960,332 A | 9/1999 | Michalzik | |
| 6,031,524 A | 2/2000 | Kunert | |
| 6,532,152 B1* | 3/2003 | White et al. | 361/692 |
| 2001/0024945 A1 | 9/2001 | Inomata et al. | |
| 2004/0102208 A1 | 5/2004 | Nuovo et al. | |
| 2004/0114318 A1* | 6/2004 | Nuovo et al. | 361/683 |
| 2004/0203518 A1 | 10/2004 | Zheng et al. | |
| 2004/0228074 A1 | 11/2004 | Tu et al. | |
| 2005/0213291 A1* | 9/2005 | Chi | 361/681 |

FOREIGN PATENT DOCUMENTS

| | | |
|---|---|---|
| CN | 2567922 Y | 8/2003 |
| CN | 1474643 A | 2/2004 |
| CN | 2737120 Y | 10/2005 |
| EP | 1130879 A1 | 9/2001 |
| JP | 2001203478 A | 7/2001 |
| JP | 2006121221 A | 5/2006 |

* cited by examiner

*Primary Examiner*—Jayprakash N Gandhi
*Assistant Examiner*—Anthony M Haughton
(74) *Attorney, Agent, or Firm*—Kramer Levin Naftalis & Frankel LLP

(57) ABSTRACT

A cold worked stainless steel bezel for a portable electronic device is provided. The bezel is secured flush to a housing to form part of the case of the portable electronic device. A brace that includes a slot for receiving a wall extending from the bezel is fixed to the housing. When the bezel engages the housing, the wall of the bezel is inserted in the slot of the brace and releasably held by a spring that engages both the brace and the wall. The bezel can be released by disengaging the spring, (e.g., using a special tool or a magnetic field). Because the bezel is manufactured from cold worked stainless steel, it is hard and resistant to impacts. Cold worked steel also facilitates manufacturing within design constraints and tolerances, and requires very little machining after manufacturing to comply with those constraints. The portable electronic device may include a personal media device, a mobile telephone, or any other suitable device or combination thereof.

11 Claims, 7 Drawing Sheets

COLD WORKED METAL HOUSING FOR A PORTABLE ELECTRONIC DEVICE

BACKGROUND OF THE INVENTION

This invention is directed to a cold worked stainless steel bezel for a portable electronic device.

By their very nature, portable electronic devices (e.g., MP3 players, cellular telephones) are carried around and subject to impacts and inadvertent blows to which static electronic devices (e.g., desk-top computers, televisions) are not subject. To protect the electronic systems of these portable devices, manufacturers have constructed impact resistant cases.

Existing cases, however, are not always easily manufactured, aesthetically pleasing, or sufficiently resistant to impacts. Accordingly, there is a need for a hard, easily manufactured and aesthetically pleasing case for portable electronic devices.

SUMMARY OF THE INVENTION

A bezel for a portable electronic device case is provided. The bezel is configured to be releasably engaged with a housing to form the case. The bezel includes an attachment portion that extends from the outer surface of the bezel such that the attachment portion is received in a brace fastened to the housing. The brace includes a slot configured to simultaneously receive the attachment portion and a spring. The spring is configured to engage both a lip of the brace and an engagement member of the attachment portion. The brace is secured to the housing when both the brace and the attachment portion engage the spring. When the case is assembled, the bezel and the housing are flush.

The bezel may be constructed from cold worked stainless steel. By cold working the steel during or prior to manufacturing of the bezel, the steel undergoes a martensitic transformation that increases the hardness of the bezel, which may provide the bezel with desired impact and scratch resistant properties. A cold working manufacturing process also allows the bezel to be manufactured with greater precision than other manufacturing processes. This limits the post-manufacturing machining required to ensure that the bezel satisfies design tolerances (e.g., the attachment portion fits snugly in the slot of the brace, and the outer surface of the bezel is flush with the housing) and reduces costs. The bezel may also be polished to provide an aesthetically pleasing finish.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

In accordance with the present invention, a cold worked steel bezel for a portable electronic device is provided.

Figure 1:
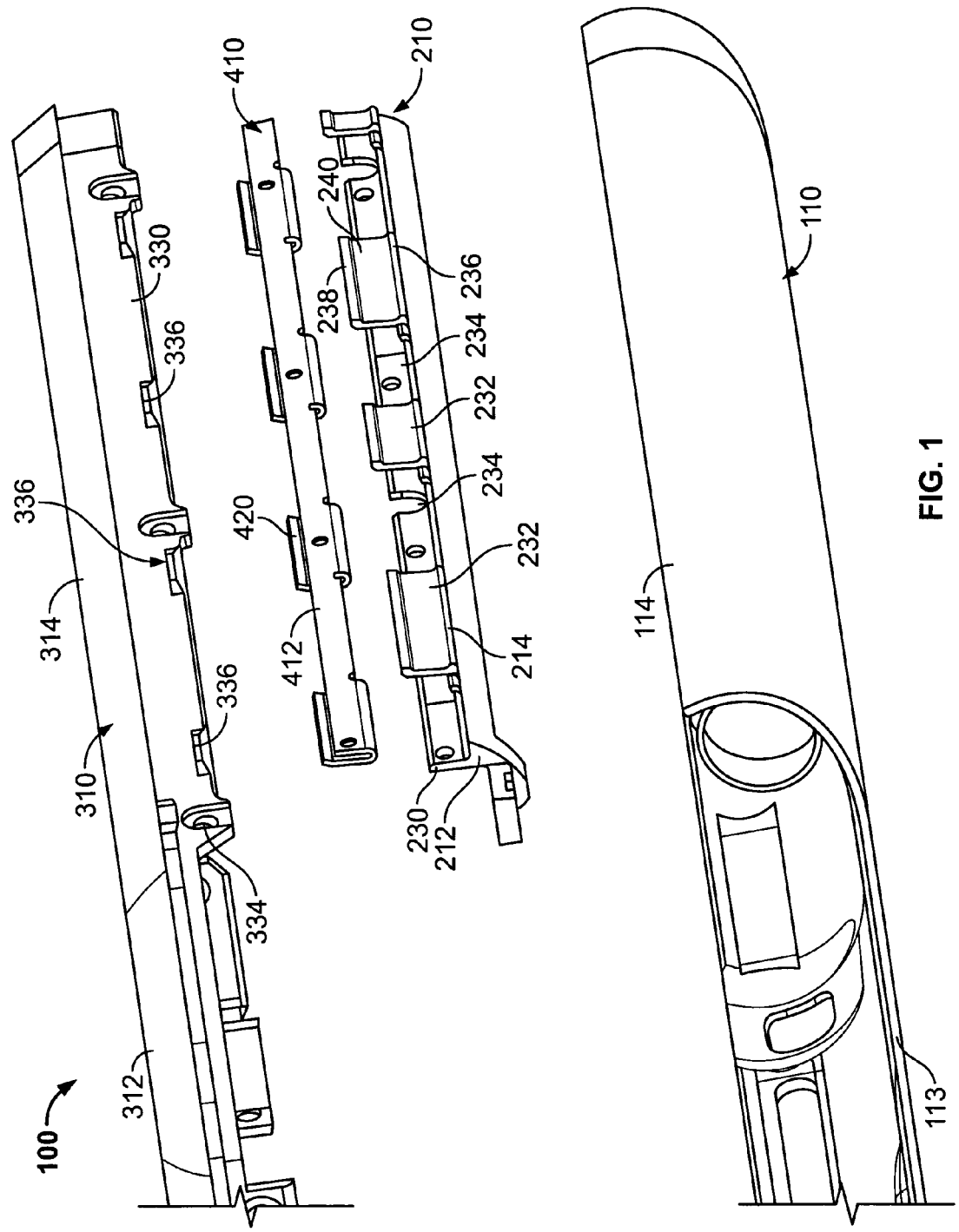
FIG. 1 is an exploded view of a portable electronic device in accordance with an embodiment of the present invention.
Figure 2:
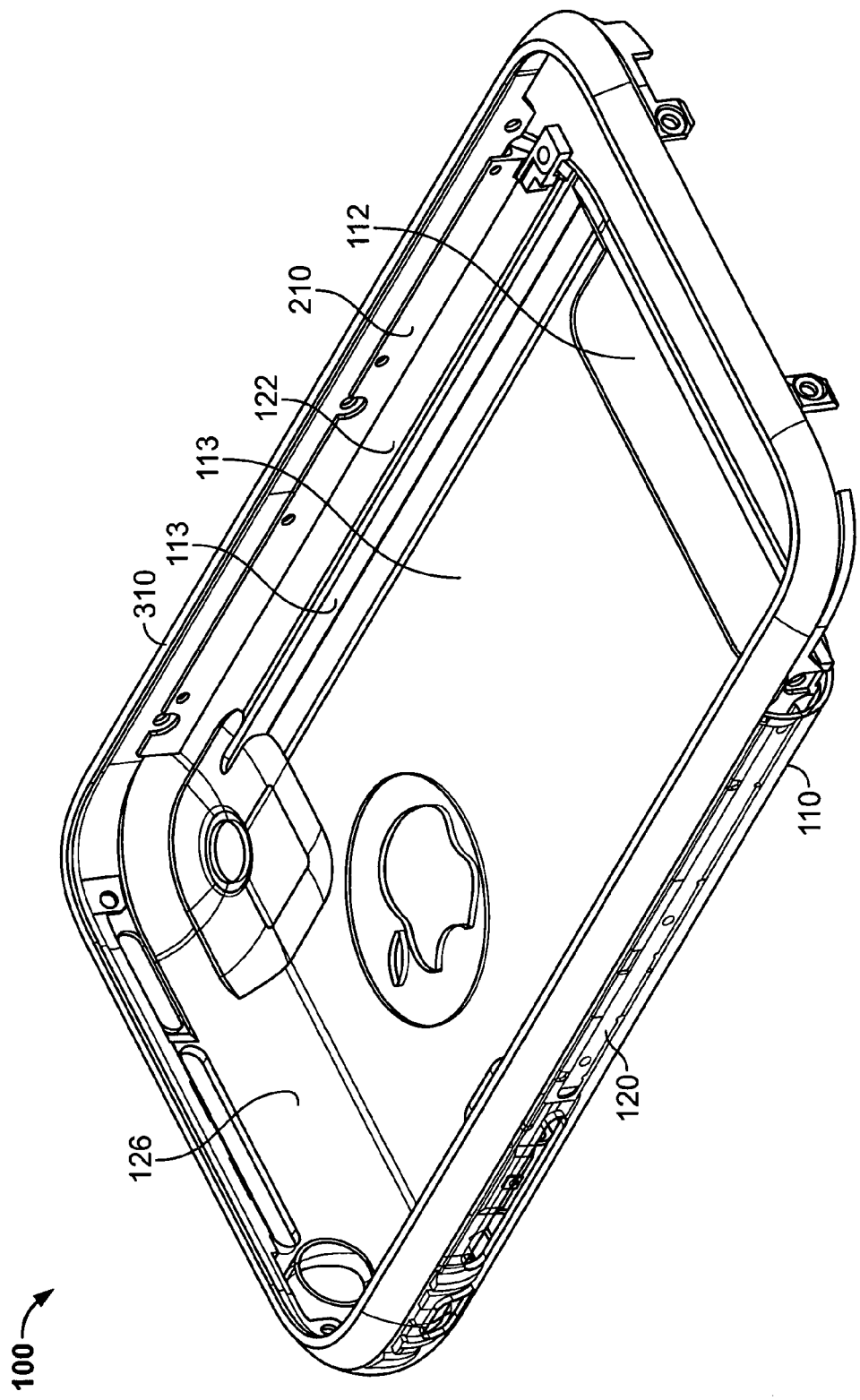
FIG. 2 is a perspective view of the assembled portable electronic device case of FIG. 1 in accordance with an embodiment of the present invention.

FIG. 1 is an exploded view of the elements of an illustrative portable electronic device case in accordance with an embodiment of the invention. FIG. 2 is a perspective view of the assembled portable electronic device case of FIG. 1 in accordance with an embodiment of the present invention. Case 100 includes bottom housing 110, brace 210, bezel 310, and spring 410. Bottom housing 110 includes substantially level plate 112 that curves away from level plate 112 to form side walls 114. Inner surface 113 of plate 112 (i.e., the surface of plate 112 that faces the electronics of the portable electronic device) can include topographical features for receiving or supporting particular electronics elements (e.g., indentations, perforations, ridges and slots).

Bottom housing 110 can be in any suitable shape. For example, bottom housing 110 can be substantially rectangular, square, elliptical, circular, irregular, or any other suitable shape. In the example of FIG. 1, bottom housing 110 is substantially rectangular. Bottom housing 110 can include left side 120, right side 122, bottom 124 (not shown) and top 126. The corners of bottom housing 110 where adjacent sides meet (e.g., right side 122 and top 126) may be rounded to provide a housing having a comfortable feel (e.g., no hard angles).

Figure 3:
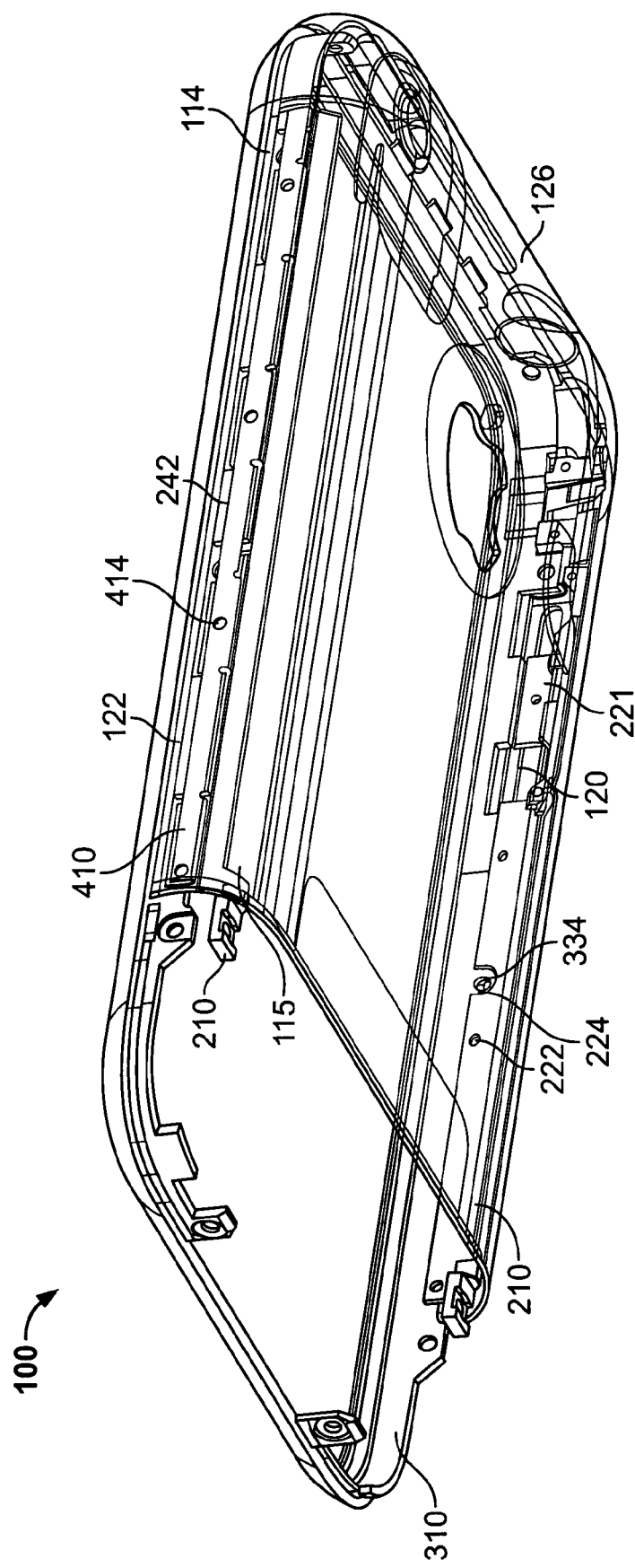
FIG. 3 is a wire frame perspective view of the bottom of the assembled portable electronic device case of FIG. 2 in accordance with an embodiment of the present invention.

FIG. 3 is a wire frame perspective view from the bottom of the assembled portable electronic device case of FIG. 2 in accordance with an embodiment of the invention. As shown in FIGS. 2 and 3, brace 210 can be fastened to bottom housing 110 to provide a support for coupling bottom housing 110 and bezel 310. Brace 210 can be fastened to bottom housing 110 in any suitable manner including, for example, an adhesive. In this example, inner surface 115 of side walls 114 may be substantially smooth to provide a suitable surface for gluing brace 210 to side walls 114. As another example, brace 210 and side walls 114 of bottom housing 110 may include complimenting structures (e.g., a tab extending from brace 210 and corresponding notch in bottom housing 110) for fastening brace 120 to bottom housing 110. As still another example, brace 110 may be fastened to bottom housing 110 using a fastener (e.g., a screw, bolt and nut, or a clip). In other embodiments, any other suitable manner or combinations of manners for fastening brace 210 to bottom housing 110 may be used.

Brace 210 may be fastened to any portion of bottom housing 110. For example, case 100 may include two braces 210 that are fastened to left side 120 and right side 122 of bottom housing 110. As another example, braces 210 may be fastened instead or in addition to bottom 124 (not shown), top 126, or one or more corners of bottom housing 110. Case 100 may include several designs for brace 210, each design configured to be fastened to a different portion of bottom housing 110 (e.g., left side 120 or right side 122). In some embodiments, brace 210 may be designed to be fastened to two or more sides of bottom housing 110 (e.g., brace 210 configured to be fastened to top 126, the top portion of left side 120, and the top portion of right side 122).

Figure 4:
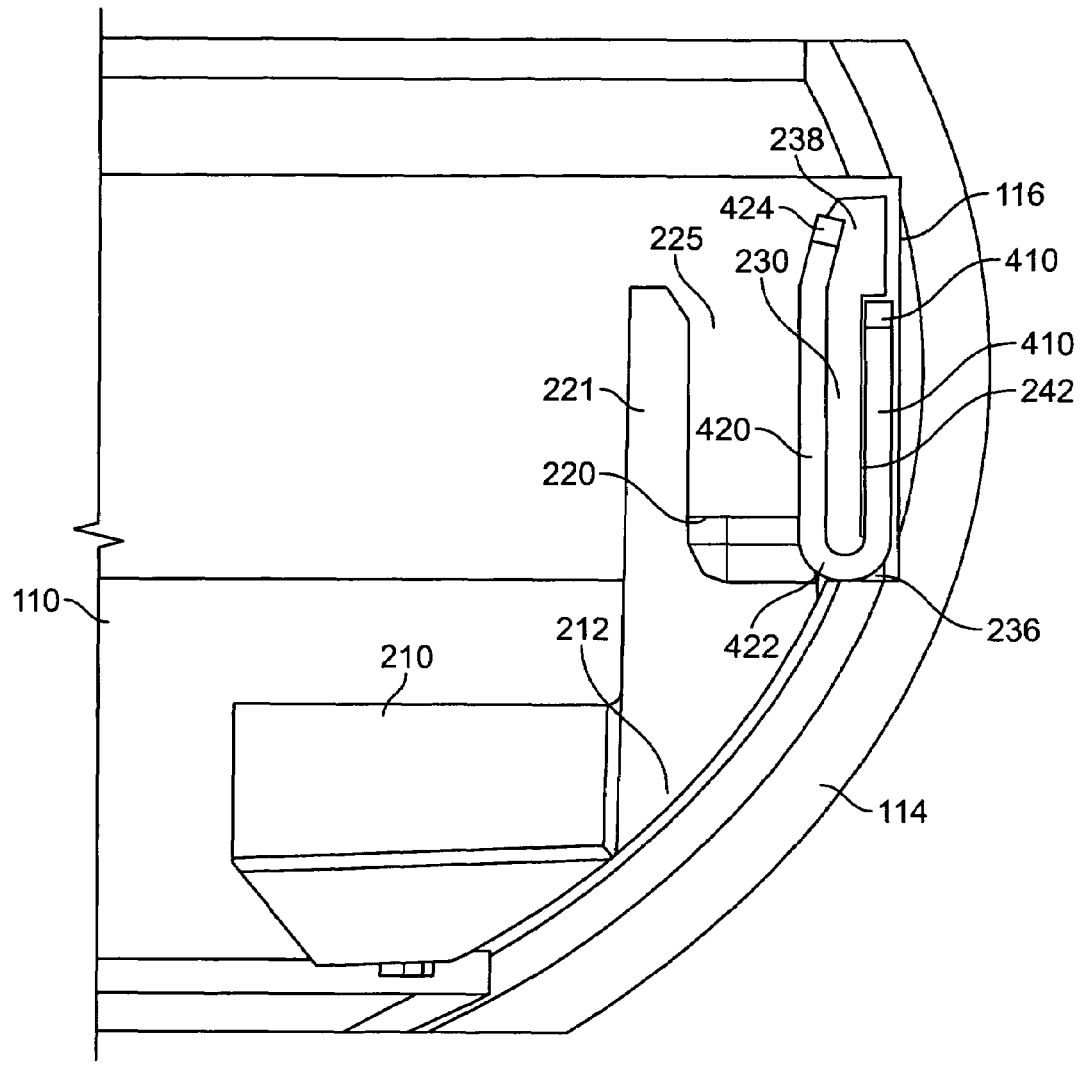
FIG. 4 is an end view of a brace and spring of the portable electronic device case of FIG. 1 in accordance with an embodiment of the present invention.

Brace 210 can include any suitable structure for fastening to bottom housing 110 or for engaging bezel 310. FIG. 4 is an end view of a brace and spring of the portable electronic device case of FIG. 1 in accordance with an embodiment of the invention. As shown in FIG. 4, brace 210 includes smooth lower portion 212 and irregular upper portion 220. Lower portion 212 may be a curved surface whose curvature matches that of side walls 114. The matching curvature may allow lower portion 212 to be fixed tightly to the inner surface of side walls 114 (e.g., using an adhesive). Brace 210 also includes upper lip 238 that extends from the periphery of brace 210 and is configured to be received by notches 116 in side wall 114.

Upper portion 220 may include several elements for engaging bottom housing 110 and bezel 310. In the example of FIG. 1, upper portion 220 includes interior wall 221 and exterior wall 230 (with respect to the center of the portable electronic device) that define U-shaped slot 225. Interior wall 221 may be a continuous or discontinuous wall that includes apertures 222 and cutouts 224 (shown in FIG. 3). Cutouts 224 may be aligned with apertures 334 of bezel 310 (and with apertures 414 of spring 410) such that case 110 to align brace 210 and bezel 310 when case 100 is assembled. In some embodiments, cutouts 224 and apertures 334 (and apertures 414 of spring 410) may be configured to receive fasteners (e.g., screws) to secure case 100. The surfaces of walls 221 and 230 that define slot 225 may be substantially smooth so as to receive bezel 310 tightly in slot 225.

Exterior wall 230 may be a discontinuous wall that is slightly recessed from outermost edge 214 of lower portion 212 (shown in FIG. 1). Exterior wall 230 may include several wall elements 232 that are separated by free space 234. Each wall element 232 includes lower lip 236 and upper lip 238 (with respect to lower portion 212) that extend out from each wall element 232 towards bottom housing 110 and away from the electronics contained within case 100. Lower and upper lips 236 and 238 may be configured to extend into notch 116 of side wall 114. Lower and upper lips 236 and 238 define recessed portion 240 of wall elements 232.

As shown in FIGS. 3 and 4, brace 210 may include ribs 242 extending parallel to wall elements 232 from edge 214 in free space 234. Ribs 242 may define a U-shaped enclosure for receiving and/or capturing spring 410.

Figure 5:
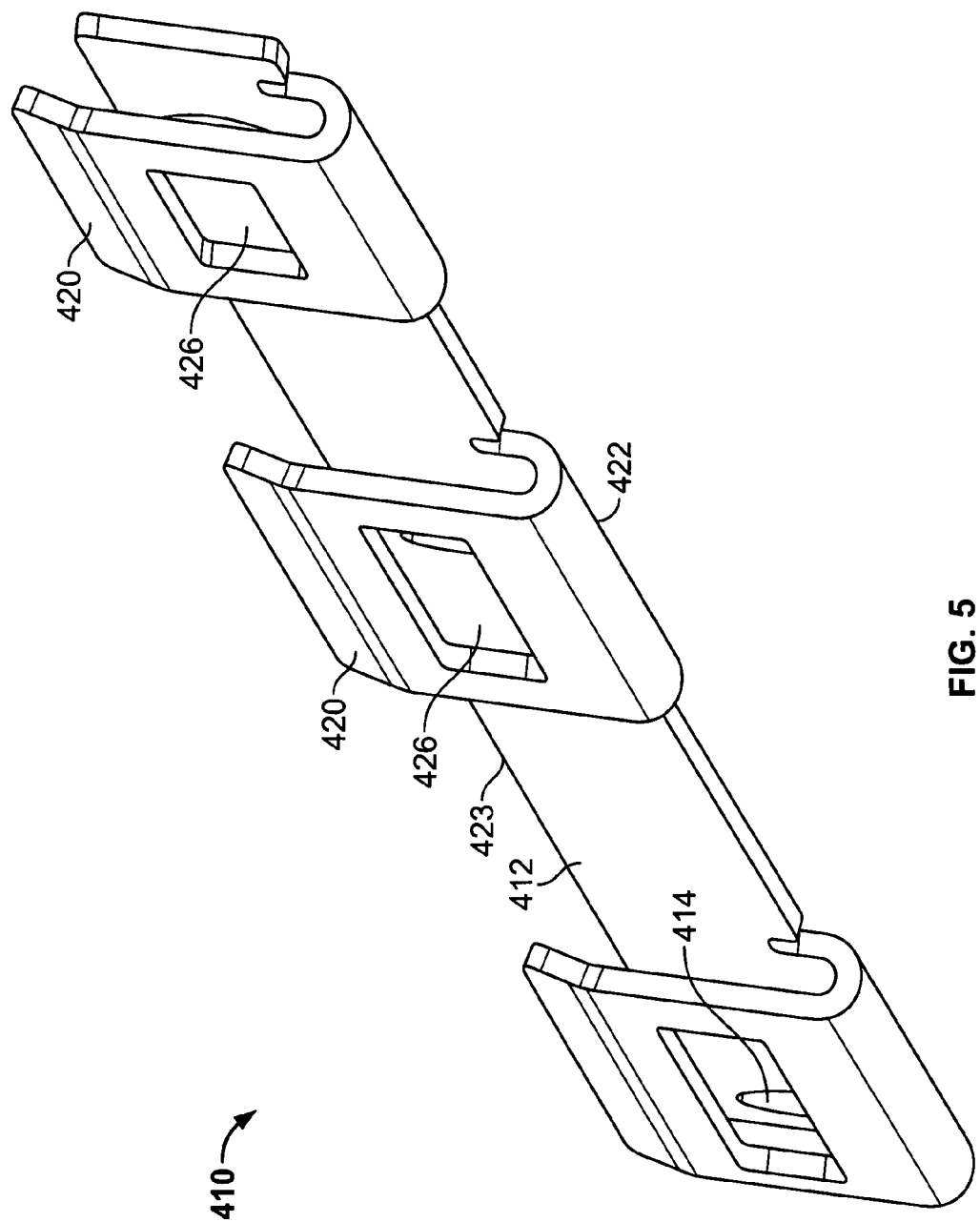
FIG. 5 is a perspective view of a spring of the portable electronic device case of FIG. 1 in accordance with an embodiment of the present invention.

Spring 410 may be used to releasably couple brace 210 to bezel 310. FIG. 5 is a perspective view of a spring of the portable electronic device case of FIG. 1 in accordance with an embodiment of the invention. As shown in FIGS. 1 and 5, spring 410 may include elongated strip 412 that features apertures 414 at intervals calculated to coincide with features of bezel 310 (described below in more detail in connection with FIG. 6). Spring 410 includes several U-shaped cantilevers 420 that are distributed along strip 412.

Spring 410 may be configured to be received in brace 210. In particular, elongated strip 412 may be received in recessed portion 240 such that a portion of strip 412 is captured in ribs 242. The distance between lower and upper lips 236 and 238 (i.e., the height of recessed portion 240) and the width of strip 412 may be selected such that strip 412 may fit securely between lips 236 and 238 (e.g., in a press fit relation), and ribs 242 may further be designed secure and maintain strip 412 in recessed portion 240 (e.g., with a notch for securing strip 412). Spring 410 may further be secured in brace 210 by the proximity of side wall 114 of bottom housing 110, which borders spring 410 on the side that is not adjacent to brace 210.

Cantilevers 420 may be distributed along spring 412 such that cantilevers 420 fit within free space 234 of brace 210. As shown in FIG. 4, which is an end view of brace 210 and spring 410, cantilevers 420 are attached to lower edge 422 of strip 412, and bent toward upper edge 423 of strip 412 such that a front or rear view of spring 410 shows a U-shape. Tip 424 of cantilever 420 is a free tip that may be configured to bend elastically in response to an external force on cantilever 420 (e.g., as a cantilever spring). For example, cantilever 420 may bend when bezel 310 is pressed into bottom housing 110 and brace 210. Each cantilever 420 may include an aperture 426.

When spring 410 is placed in brace 210, cantilevers 420 extend from exterior wall 230 towards interior wall 221 such that cantilever 420 takes the place of wall elements 232 in free space 234 (FIG. 1). Apertures 426 may be configured to receive tabs or protrusions of bezel 310 (e.g., engaging member 336) such that bezel 310 engages spring 410.

Figure 6:
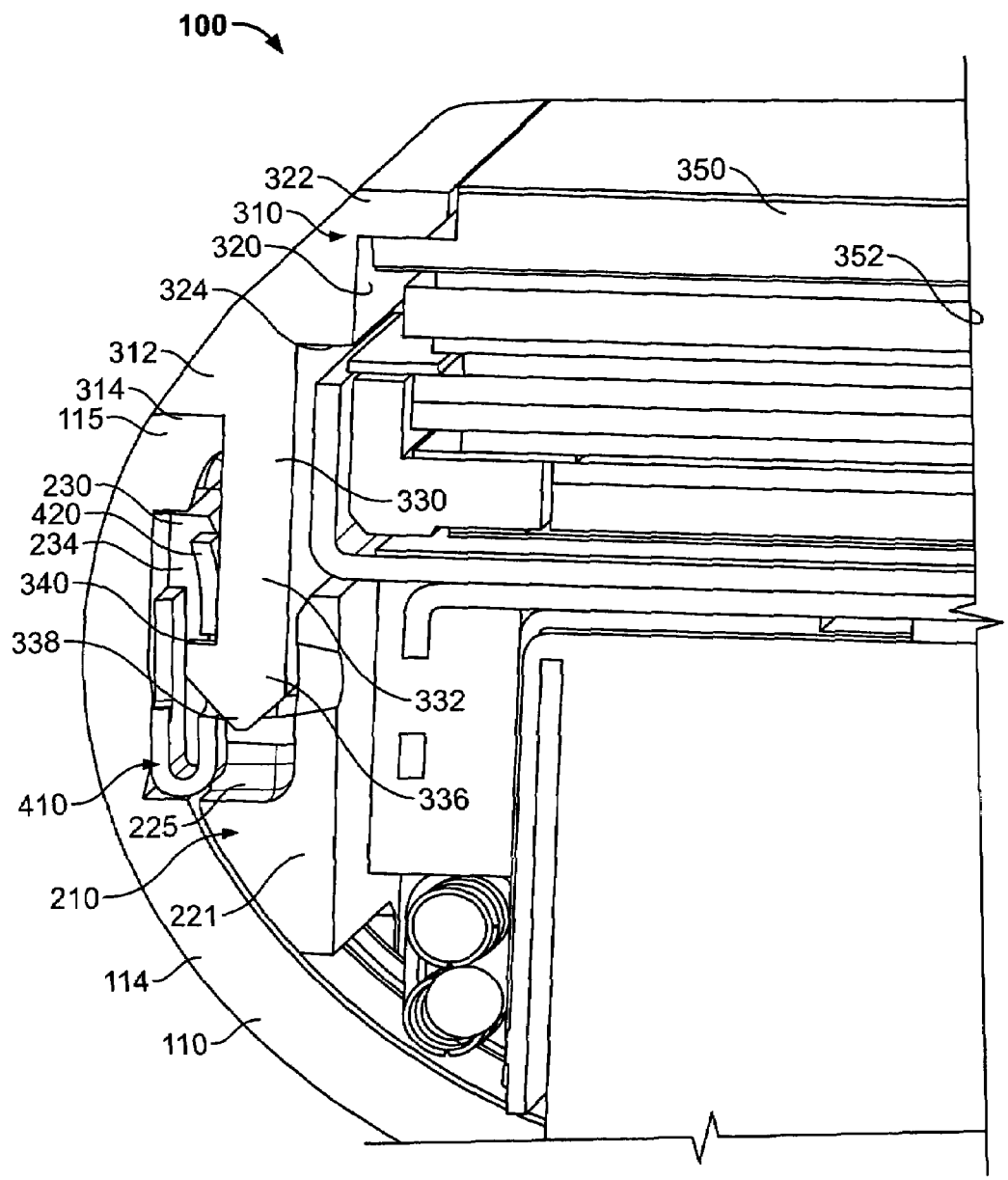
FIG. 6 is a cross-sectional view of the assembled portable electronic device case of FIG. 2 in accordance with an embodiment of the present invention.

Bezel 310 may be configured to be placed over bottom housing 110 to assemble case 100. As shown in FIGS. 1 and 6 (described in more detail below), bezel 310 may include base structure 312 that provides the outer upper surface of case 100. Inner surface 320 of structure 312, shown in FIG. 6, includes steps 322 and 324 for supporting electronic or other components of the portable electronic device. For example, step 322 may be configured to support screen 350 and step 324 may be configured to support reflective layer 352. Inner surface 320 may include any other suitable feature for supporting one or more components of the portable electronic device (e.g., an input component such as a scroll wheel).

Lower surface 326 of base structure 312 is substantially level and configured to be placed against the top surface 115 of wall 114 when bezel 310 is engaged with bottom housing 110. Both lower surface 326 and top surface 115 may be designed to remain in close contact when case 100 is assembled. For example, lower surface 326 and top surface 115 may include complimentary features configured to unite and provide a tight fit. Bezel 310 may be constructed using methods and materials that allow for very tight tolerances in all directions (e.g., x, y and z directions), which may ensure that bezel 310 is flush with bottom housing 110 when case 100 is assembled.

Outer surface 314 of base structure 312 may be a curved structure configured to be flush with side walls 114 when bezel 310 engages bottom housing 110. Outer surface 314 may be polished to provide an aesthetically pleasing finish to bezel 310. Outer surface 314 may be polished in any suitable manner including, for example, with an abrasive disk having 120 or 240 grit silicone carbide, a grinding disk or cloth having 3 or 9 µm diamond suspension, or a cloth having 0.05 µm colloidal silica or alumina suspensions.

Attachment portion 330 extends from base structure 312 towards bottom housing 110 and brace 210. Attachment portion 330 includes wall 332 that extends beyond lower surface 326. In some embodiments, wall 332 is not continuous, but includes discrete segments distributed around the periphery of bezel 310. To provide a strong connection between bezel 310 and brace 210, wall 332 may be continuous in the sections of attachment portion 330 that are configured to be placed in slot 225 of brace 210. Attachment portion 330 may include a plurality of apertures 334 that are aligned with apertures 414 of spring 410 and cutouts 224 when case 100 is assembled to assist in aligning brace 210, bezel 310 and spring 410. In some embodiments, apertures 334, 414 and cutouts 224 may be configured to receive a fastener (e.g. a screw) for securing bezel 310 to bottom housing 110.

The sections of wall 332 that are configured to be placed in slot 225 may include one or more engaging members 336. Engaging members 336 may be tabs or other such elements that extend from wall 332 toward the exterior of the portable electronic device. Each engaging members 336 may include angled tip 338 and level tab 340 for engaging at least one of apertures 426 and 414 of cantilever 420.

FIG. 6 is a cross-sectional view of the assembled portable electronic device case of FIG. 2 in accordance with an embodiment of the present invention. To engage bezel 310 with brace 210, spring 410 is first placed and captured in brace 210. Bezel 310 may then be pressed into brace 210 such that wall 332 extends into slot 225. When bezel 310 is pressed into bottom housing 110, wall 332 is inserted in slot 225 and engaging members 336 press cantilevers 420 into free space 234 to create enough room to fully occupy slot 225. Angled tip 338 may be configured to progressively apply a force on cantilever 420 to progressively deflect cantilever 420 as bezel 310 is pushed into housing 110. Once wall 332 has been fully inserted in slot 225, aperture 426 is aligned with tab 340 (e.g., by designing the placement of aperture 426 appropriately). Tab 340 then extends into aperture 426 and ceases to apply a force on cantilever 420, which springs back to its equilibrium position in free space 224. Tab 340 then engages aperture 426 and prevents wall 332, and thus bezel 310, from disengaging brace 210 unless tab 340 is released from spring 410.

To disengage bezel 310 from brace 210 and bottom housing 110, an external force may be applied to spring 410 that forces cantilevers 420 to bend away from wall 332 such that engaging members 336 are released from apertures 426. Once engaging members 336 are released, bezel 310 may be removed from slot 225. The external force may be applied to spring 410 in any suitable manner. For example, a tool may be configured to be inserted in case 100 to engage cantilever 420. As another example, if cantilever 420 is made from a material that is subject to a magnetic force in the presence of a magnetic field, a magnetic field (e.g., provided by a magnet) may provide an external force for disengaging engaging members 336. Suitable materials that are operative to move in the presence of a magnetic field include ferrite materials such as, for example, cold worked 304 stainless steel or 404 stainless steel.

The elements of case 100 may be manufactured using any suitable manufacturing process and using any suitable material. For example, bottom housing 110 may be formed using one or more of casting, molding (e.g., power metallurgy molding), forging, machining, rolling, extrusion, milling, or any other suitable manufacturing process. Bottom housing 110 may also be finished using any suitable manufacturing process including, for example, polishing, buffing, burnishing, grit, shot or sand blasting, tumbling, wire brushing, flame blasting, electropolishing, or any other suitable process for finishing bottom housing 110 (e.g., to provide an aesthetically pleasing appearance). Bottom housing 110 may be constructed from any suitable material such as, for example, aluminum, steel, iron alloys, titanium, magnesium, copper alloys, other metallic alloys, plastics, polymers, ceramics or composites. In one embodiment, bottom housing 110 may be constructed from aluminum.

Brace 210 and spring 410 may be constructed using one or more of the manufacturing processes listed above in connection with forming bottom housing 110. In addition, brace 210 and spring 410 may be constructed using one or more of the materials listed above in connection with bottom housing 110. In one embodiment, brace 210 may be made from a magnesium and spring 410 may be made from stainless steel (e.g., 404 series stainless steel).

Bezel 310 may also be constructed using one using one or more of the manufacturing processes and one or more of the materials listed above in connection with forming bottom housing 110. In one embodiment, bezel 310 may be constructed using stainless steel such as, for example, 304 stainless steel. 304 stainless steel may be hardened by cold work, and enable bezel 310 to withstand heavy loads and impacts (e.g., caused by dropping the portable electronic device).

304 stainless steel is an austenitic steel, which is a non-magnetic solid solution of iron and carbon. The iron and carbon molecules are arranged in a face-centered cubic (FCC) lattice structure that contains a high proportion of carbon as compared to ferrite, which has a body-centered cubic lattice structure. The higher density of carbon atoms in austenitic steel exhibits a more durable and harder material than ferrite. Austenitic steels may contain a maximum of 0.15% carbon, a minimum of 16% chromium and sufficient nickel and/or manganese to retain an austenitic structure (i.e., FCC lattice structure) at all temperatures from the cryogenic region to the melting point of the alloy. Without the addition of sufficient nickel and/or manganese, the FCC lattice structure is unstable and may revert to a BCC lattice structure (i.e., revert from austenitic steel to ferrite). 304 stainless steel has a composition of 18% chromium and 8% nickel, commonly known as 18/8 stainless steel, and is one of the most common grades of stainless steel.

Some metals may be strengthened by heat treatment, which is typically used to manipulate the properties of a metal by controlling the rate of diffusion of particles in the metal, and the rate of cooling within the microstructure. Austenitic steels such as 304 stainless, however, cannot be strengthened by heat treatment alone. Instead, two other methods may be used: plastic deformation of the steel, and refining the grain size of the steel.

Plastic deformation of a material is an irreversible deformation of the material. In the particular case of austenitic steel, a plastic deformation causes an irreversible modification of the crystal structure of the steel. The modification creates irregularities in the lattice structure of the crystals, which are called dislocations (e.g., edge and screw dislocations). As more dislocations are introduced in the material by further plastic deformation (e.g., by the formation of new dislocations and dislocation multiplication), the strain fields of adjacent dislocations overlap and gradually increase the material's resistance to additional dislocation. This causes the material to become harder. This effect is known as strain hardening or work hardening.

One process for hardening the material by plastic deformation is cold work, which is the process by which material is hardened as a result of plastic deformation of the material at low to moderate temperatures. Cold work may be provided by any suitable process that is performed at low temperatures such as, for example, extrusion, drawing or coining.

Plastic deformation of an austenitic steel, such as 304 stainless steel, may induce martensitic transformation. The martensitic transformation is the transformation of austenite in the austenitic steel to martensite. Austenite and martensite have an identical chemical composition, and very similar crystal structures, where the cubic structure of austenite is distorted by interstitial atoms of carbon that do not have time to diffuse out during the process causing transformation (e.g., plastic deformation or quenching) form martensite. Martensite is thus supersaturated with carbon. The carbon atoms cause the martensite crystal structure to stretch, which stretches the crystal lattice of the metal and creates additional strain, therefore creating additional strain fields that combine with those of the dislocations caused by the plastic deformation to harden the material.

For plastic deformation to be effective to form martensite, it must occur below the martensitic deformation temperature of the material. Because the martensitic deformation temperature ($M_d$) is dependent on chemistry and initial grain size, it is difficult to determine, and an approximation is used instead. One suitable approximation is $M_{d30}$, which varies similarly to $M_d$. $M_{d30}$ is the temperature at which 50% of the microstructure would transform to martensite given a 30% true strain.

The grains in an austenitic steel may be refined by annealing the steel after cold work. Annealing the metal causes the crystals in the material to recrystallize and nucleate and grow larger grains. Dislocations in the crystal lattice caused by cold work disappear as new grains are formed. There is a point, however, where a material may be cold worked at a level where there are too many dislocations for recrystallization using annealing to be practical.

The annealed material may be cooled in any suitable manner including, for example, cooled in the furnace (i.e., full anneal heat treatment), in air (i.e., normalizing heat treatment), or quenched (e.g., quickly cooled). The metal may be quenched, for example, with forced air or gas (e.g., nitrogen), in oil, polymer dissolved in water, water, or brine. Quenching may cause the introduction of martensite in the austenitic steel, which is harder than austenite. The steel must be rapidly cooled through its eutectoid point, the temperature at which austenite becomes unstable, for martensite to be introduced.

The resulting grain size and distribution in the material may depend on the amount of cold work prior to annealing (e.g., the number of dislocations in the steel prior to heat treatment), the annealing temperature, the duration the metal is left in the furnace, and the cooling temperature. For example, the longer the steel is left in the furnace, and the higher the furnace temperature, the more new grains are nucleated and the more dislocations are eliminated (e.g., leading to a more ductile steel). As another example, if the steel is rapidly cooled through its eutectoid point, martensite may be introduced (e.g., hardening the steel).

304 stainless steel may be polished to provide an aesthetically pleasing surface (e.g., aesthetically pleasing outer surface 314 of base structure 312). The steel may be polished using a sequence of polishing steps at different grits (e.g., higher grits as the sequence progresses).

Bezel 310 (and spring 410) may be manufactured from 304 stainless steel using a cold worked process which, as discussed above, provides high strength. But cold working also provides for very precise constraints in all directions (e.g., x, y and z directions) without additional manufacturing processes. This combination of properties may make cold working a preferable process for manufacturing bezel 310. For example, cold working may be substantially cheaper than machining, which includes a cost for the skilled machining labor. As another example, a cold worked metal component may be stronger than a die cast metal component, as it is difficult to cast stainless steel (e.g., alloys tend to pull away from the steel, leaving a weaker structure). In addition, die casting may be imprecise, and require post-casting machining to resize components within the design tolerances.

For bezel 310 to be perfectly flush with bottom housing 110, bezel 310, spring 410 and housing 110 may be manufactured with tight tolerances. In particular, wall 332 and tab 340 may be manufactured precisely so that wall 332 fits flush in slot 225 and tab 340 engages at least one of apertures 426 and 414. Also, lower surface 326 of base structure 312 of bezel 310 and surface 115 of wall 114 of bottom housing 110 may be manufactured precisely so that lower surface 332 and surface 115 are flush, and outer surface 314 of bezel 310 is flush with the outer surface of wall 114. Manufacturing at least bezel 310 (and bottom housing 110, brace 210 and spring 410) using a cold work process provides a near perfect net component that only requires minimal machining or touching up to satisfy the tight tolerance requirements of the component.

Figure 7:
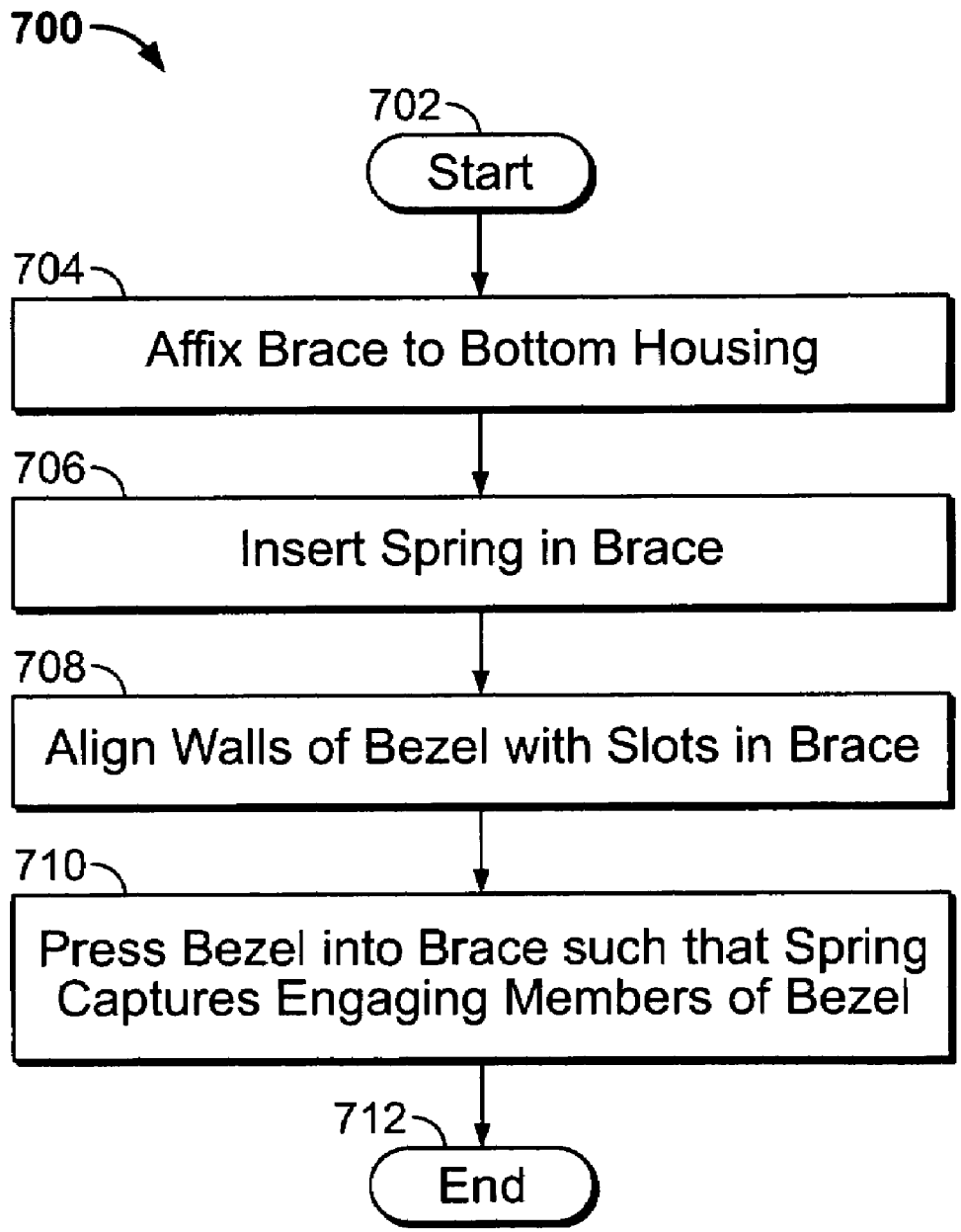
FIG. 7 is a flow chart of an illustrative process for assembling a bezel with a housing to form the case of a portable electronic device in accordance with an embodiment of the present invention.

The following flow chart will serve to illustrate a process involved in some embodiments of this invention. FIG. 7 is a flow chart of an illustrative process for assembling a bezel with a housing to form the case of a portable electronic device in accordance with an embodiment of the present invention. Process 700 begins at step 702. At step 704, a brace is affixed to the inner surface of the housing of the case. The brace may be affixed using any suitable approach including, for example, an adhesive or a fastener. The brace may include a rib for securing a spring, and a slot for receiving the bezel. At step 706, a spring is inserted and secured in the brace. The spring may be configured to fit in a rib of the brace such that the spring remains positioned within the rib. In some embodiments, the order of steps 704 and 706 may be reversed.

At step 708, the bezel is placed over the brace, and the walls of the attachment portion of the bezel are aligned over the slot of the brace. At step 710, the bezel is pressed into the brace such that the wall is inserted in the slot of the brace, and such that at least one engaging member of the bezel engages an aperture in the spring. The case is assembled once the spring simultaneously engages the brace and the bezel. Process 700 then ends at step 712.

In another embodiment, the assembly process may be performed as follows. The spring may be assembled to the brace. The spring/brace combination is assembled to bezel, which may cause the spring to be captured between the bezel and the brace.

The above described embodiments of the present invention are presented for purposes of illustration and not of limitation, and the present invention is limited only by the claims which follow.

What is claimed is:

1. A portable electronic device, comprising: a housing enclosing circuitry to execute at least one function of the electronic device, wherein the circuitry is electrically connected to a display; a component comprising: a first planar surface having a plane and a periphery wherein the planar surface defines an exterior surface of the device, through which information provided by the display can be displayed; and a lip portion that is vertically stepped down from the plane of the planar surface and extends beyond the periphery of the planar surface; and a bezel comprising a top planar surface and a step portion, such that when the bezel is secured to the housing, the step portion engages the lip portion to secure the component in place on the electronic device, wherein the bezel surrounds the entire periphery of the component, wherein the top planar surface is substantially co-planar to the first planar surface.

2. The device of claim 1, wherein the bezel sits substantially flush against the housing.

3. The device of claim 1, wherein the bezel forms a uniform peripheral structure of the electronic device.

4. The device of claim 1, wherein the bezel provides structural support.

5. The device of claim 1, wherein the bezel circumnavigates a periphery of the component.

6. The device of claim 1, wherein the bezel has a metallic appearance.

7. The device of claim 1, wherein a union between the housing and the bezel forms a substantially continuous surface.

8. A portable electronic device comprising: a housing enclosing circuitry to execute at least one function of the electronic device, wherein the circuitry is electrically connected to a display; a screen comprising a first planar surface, through which information provided by the display can be displayed; and a bezel comprising a top planar surface defining an exterior surface of the device and a bottom planar surface, wherein the bottom planar surface is mounted to the housing and the top planar surface is substantially co-planar to the first planar surface, and wherein the bezel is visually distinguished in comparison to the housing.

9. The device of claim 8, wherein the bezel has a metallic appearance.

10. The device of claim 8, wherein a union between the housing and the bezel forms a substantially continuous surface.

11. The device of claim 8, wherein the bezel forms a uniform peripheral structure of the electronic device.

* * * * *